United States Patent [19]

Peterson

[11] Patent Number: 5,493,720
[45] Date of Patent: Feb. 20, 1996

[54] HIGH-INTERCEPT BANDLIMITED MIXER

[75] Inventor: Dean F. Peterson, Andover, Mass.

[73] Assignee: Steinbrecher Corporation, Burlington, Mass.

[21] Appl. No.: 247,095

[22] Filed: May 20, 1994

[51] Int. Cl.$^6$ ............................................. H04B 1/26
[52] U.S. Cl. ......................... 455/326; 455/330; 455/313; 455/323
[58] Field of Search ........................... 455/313, 314, 455/323, 326, 330, 331; 327/355, 113

[56] References Cited

U.S. PATENT DOCUMENTS

| | | | |
|---|---|---|---|
| 4,817,201 | 3/1989 | Bonato | 455/326 |
| 4,896,374 | 1/1990 | Waugh et al. | 455/326 |
| 5,157,786 | 10/1992 | Muterspaugh | 455/330 |

OTHER PUBLICATIONS

Saleh, A. A. M. "Theory of Resistive Mixers", Ph.D. Thesis, Jan. 1970, Massachusetts Institute of Technology, Cambridge, Massachusetts, pp. 24–35, 94–97, 116–137, 300–340.

*Primary Examiner*—Reinhard Eisenzopf
*Assistant Examiner*—Marsha D. Banks-Harold
*Attorney, Agent, or Firm*—Fish & Richardson

[57] ABSTRACT

A mixer converting a frequency of an input signal to an intermediate frequency has an input port receiving an input signal oscillating at a signal frequency and a sinusoidal pump wave oscillating at a pump frequency. A diode is connected between an input network linked to the input port and an output network linked to an output port of the mixer. The output network and the input network together cause the diode to switch rapidly between ON and OFF states and behave as with square wave drive. Bias circuitry connected to the diode comprises a resistor connected to receive a DC component of current from the diode, the current through the resistor solely biasing the diode.

33 Claims, 8 Drawing Sheets

HIGH-INTERCEPT BANDLIMITED MIXER

BACKGROUND OF THE INVENTION

This invention relates to limited bandwidth mixers having a performance approximating that of a square-wave reversing mixer.

Mixers convert a frequency of an incoming signal to an intermediate frequency, consisting of a difference between the signal frequency and a preset pump frequency in the mixer. A high performance mixer for ultra-high frequency (UHF) and microwave signals is the Paramixer™, described in U.S. Pat. Nos. 4,112,374 and 4,230,956, and available as a component in digital receivers from Steinbrecher Corporation of Burlington, Mass. The Paramixer has a balanced and symmetrical configuration containing eight diodes that closely approximates the performance of an ideal square-wave reversing switch mixer over a broad band of input signal frequencies, ranging from 10 to 1000 MHz. The fundamental limit on conversion loss for the Paramixer is 3.92 dB when resistive terminations are applied to all frequencies, and 0 dB when all frequencies except the intermediate frequency and signal frequency are terminated properly with lossless circuit elements. A square wave local oscillator signal in the Paramixer switches the diodes rapidly between well-defined ON and OFF states to provide the Paramixer's high intercept or high dynamic range.

In theory, a single diode ideal H-mixer 10, shown in FIG. 1, also may achieve the performance of a square wave reversing switch mixer when driven by a sinusoidal pump wave under certain boundary conditions. (A. A. M. Saleh, "Theory of Resistive Mixers", Ph.D. Thesis, Massachusetts Institute of Technology, January 1970). The boundary conditions include supplying the pump wave at an appropriate drive level, and maintaining an intermediate frequency much lower than the pump frequency. Other boundary conditions limit the mixer to exchanging power only at the signal frequency, the intermediate frequency and an image frequency, consisting of the difference between the pump frequency and the intermediate frequency.

The H-mixer 10 receives both the pump wave ($V_p$) and the signal ($V_s$) at an input port 12. An ideal input filter 14 consisting of an inductor 16 and capacitor 18 in series allows a sinusoidal current to exist at only the signal frequency ($\omega_s$), the pump frequency ($\omega_p$) and the image frequency ($\omega_i = 2\omega_p - \omega_s$).

A parallel transmission line stub 20 is connected between the input filter and an exponential diode 22. The transmission line stub has a length equal to one quarter the wavelength of oscillation of the pump wave ($\lambda_p = 2\pi/\omega_p$), and thus presents a short circuit to even harmonics of the pump wave and presents an open circuit to odd harmonics of the pump wave. As a result, the voltage across the diode contains only odd harmonics of the pump frequency, and the current through the diode contains only even harmonics of the pump frequency in addition to the fundamental current.

Diode bias current passes through a grounded LC tank 24 consisting of a parallel capacitor 26 and diode 28 connected to an output port 30 of the mixer 10. The LC tank supports a voltage at the intermediate frequency ($\omega_0 = \omega_s - \omega_p$) only, while short-circuiting voltages at all other frequencies. The voltage across the output port of the mixer thus oscillates at the intermediate frequency, as required.

The mixer 10 also has a battery 32 connected in series with the LC tank that establishes DC bias for the diode. A capacitor 34 connected in parallel to the battery provides a bypass for all AC currents in the circuit.

Another ideal switch mixer, seen in FIG. 2, is an ideal G-mixer 60, a dual of the H-mixer described above. The G-mixer receives the signal and pump wave at an input port 62. A grounded LC tank 64 consisting of a parallel capacitor 66 and an inductor 68 is connected between the input port of the mixer and an exponential diode 70. The LC tank is an ideal filter supporting a voltage at only the signal frequency, the image frequency and the pump frequency. A battery 72 connected to a choke 74 in series with the diode and the LC tank provides the bias for the diode. AC currents flow between the diode and the LC tank through a quarter pump wavelength transmission line stub 76 that presents a short circuit to odd harmonics and an open circuit to even harmonics of the pump frequency. An ideal series LC filter 78 between the diode and an output port 80 of the mixer 60 ensures that only currents at the intermediate frequency are present at the output of the mixer.

SUMMARY OF THE INVENTION

In general, in one aspect, the invention features a mixer receiving an input signal wave and a sinusoidal pump wave at an input port. An input network connects the input port to a first diode. An output of the diode is connected to an output port of the mixer through a diode output network. The output network and the input network together cause the diode to switch rapidly between ON and OFF states. The diode is also biased by a resistor receiving a DC component of current from the diode. The voltage developed across the resistor by the DC current alone biases the diode.

Embodiments of the invention include the following features. The input network includes an inductor connected in series with a capacitor that together support currents at frequencies of $m\omega_p + n\omega_0$, where n and m are integers. The input network may also include a harmonic filter connected between the input port and ground. The harmonic filter short-circuits even harmonics of the pump frequency and open-circuits odd harmonics of the pump frequency that are generated in the mixer. The harmonic filter is typically provided by a transmission line stub with a length equal to one quarter a wavelength of oscillation of the pump wave.

The diode output network comprises a capacitor that supports a voltage oscillating at the intermediate frequency. The resistor in the bias circuitry comprises a grounded load resistor connected to the diode at the output port of the mixer. The resistor in the bias circuitry may also be connected between the second port of the harmonic filter and ground in parallel to a grounded capacitor.

In other embodiments, the input network comprises a capacitor and an inductor connected in parallel between the input port of the mixer and ground. The input network supports voltages oscillating at $m\omega_p + n\omega_0$. The output network comprises an inductor supporting a current at the intermediate frequency. The output network may also include a harmonic filter connected between the diode and ground. The harmonic filter open-circuits even harmonics of the pump frequency and short-circuits odd harmonics of the pump frequency.

The mixer may also include additional circuitry balancing the mixer. The circuitry has an input port, an input network, a second diode, and a diode output network identical to those described above. The circuitry is arranged as described above, but with the polarity of the second diode reversed. An output combining network connects the diode output networks together to link the diodes to the output port of the mixer. The combining network allows signals at the intermediate frequency from each diode to add at the output port, and also provides a path for DC current between the two diodes that is isolated from the output port of the mixer. The bias circuitry is connected to the second diode to bias both diodes in the same direction.

A 180 degree or a 90 degree hybrid receives the input signal at one input port of the hybrid and the pump wave voltage at the other input port of the hybrid. Different output ports of the hybrid provide combinations of the input signal and the pump wave to each input network.

Each input network has a grounded harmonic filter connected to the first output port of the hybrid. The harmonic filters short circuit even harmonics of the pump wave and open circuit odd harmonics of the pump wave. Each input network also includes circuitry supporting currents oscillating at frequencies of $m\omega_p+n\omega_0$.

The bias circuitry has two resistors, each connected to a corresponding diode through the input network, between the harmonic filters and ground. A grounded capacitor is connected in parallel to each resistor. The second diode output network includes a capacitor connected between the second diode and ground. The combining network has a capacitor connecting each diode to the output port of the mixer.

Alternatively, the resistor in the bias circuitry is connected between the diodes. The combining network has capacitors connected between each diode and the output port of the mixer.

In other embodiments, each diode output network includes a harmonic filter connected between a corresponding diode and ground. Each harmonic filter short circuits odd harmonics of the pump wave and open circuits even harmonics of the pump wave. An inductor connects each harmonic filter to the combining network.

In general, in another aspect, the invention features a method for converting a frequency of an input signal to an intermediate frequency by receiving the input signal and a sinusoidal pump wave in circuitry comprising a diode. Waveforms in the mixer are filtered to cause the diode to rapidly switch between ON and OFF states. A path including a resistance is provided in the circuitry for a DC current. The diode is biased solely by a voltage generated as the DC current follows the path, and a signal at an output port of the circuitry is produced at the intermediate frequency.

Embodiments of the invention include the following features. The path for DC current in the mixer diverts the DC current from the output port of the circuitry.

Advantages of the invention include the following.

The mixer duplicates the performance of the Paramixer™ within prescribed frequency bands. The high dynamic range of the mixer allows it to mix signals over a large range of signal levels without generating intermodulation distortion.

Circuit elements employed in the mixer are common low-loss components. The rapid diode switching in the mixer and the low-loss components ensure a low conversion loss in the mixer.

The mixer thus approximates the performance of a reversing switch mixer without requiring a square wave local oscillator, and by using as few as two diodes. The mixer also eliminates the need for a power supply biasing the diodes. The mixer can thus be manufactured at a low cost.

In addition, the mixer provides separation at its input between the signal and pump waves. The mixer also has a ground path for DC currents that is separate from the output port of the mixer. This allows a bias resistance and a load resistance to be independently specified. The diode bias and a current at the output port of the mixer can thus be independently controlled.

The mixer is thus highly useful in any limited bandwidth transceiver, e.g. a cellular transceiver operating over 825 to 850 MHz.

Other features and advantages of the invention will become apparent from the following description, and from the claims.

DESCRIPTION OF THE PREFERRED EMBODIMENTS

Figure 1:
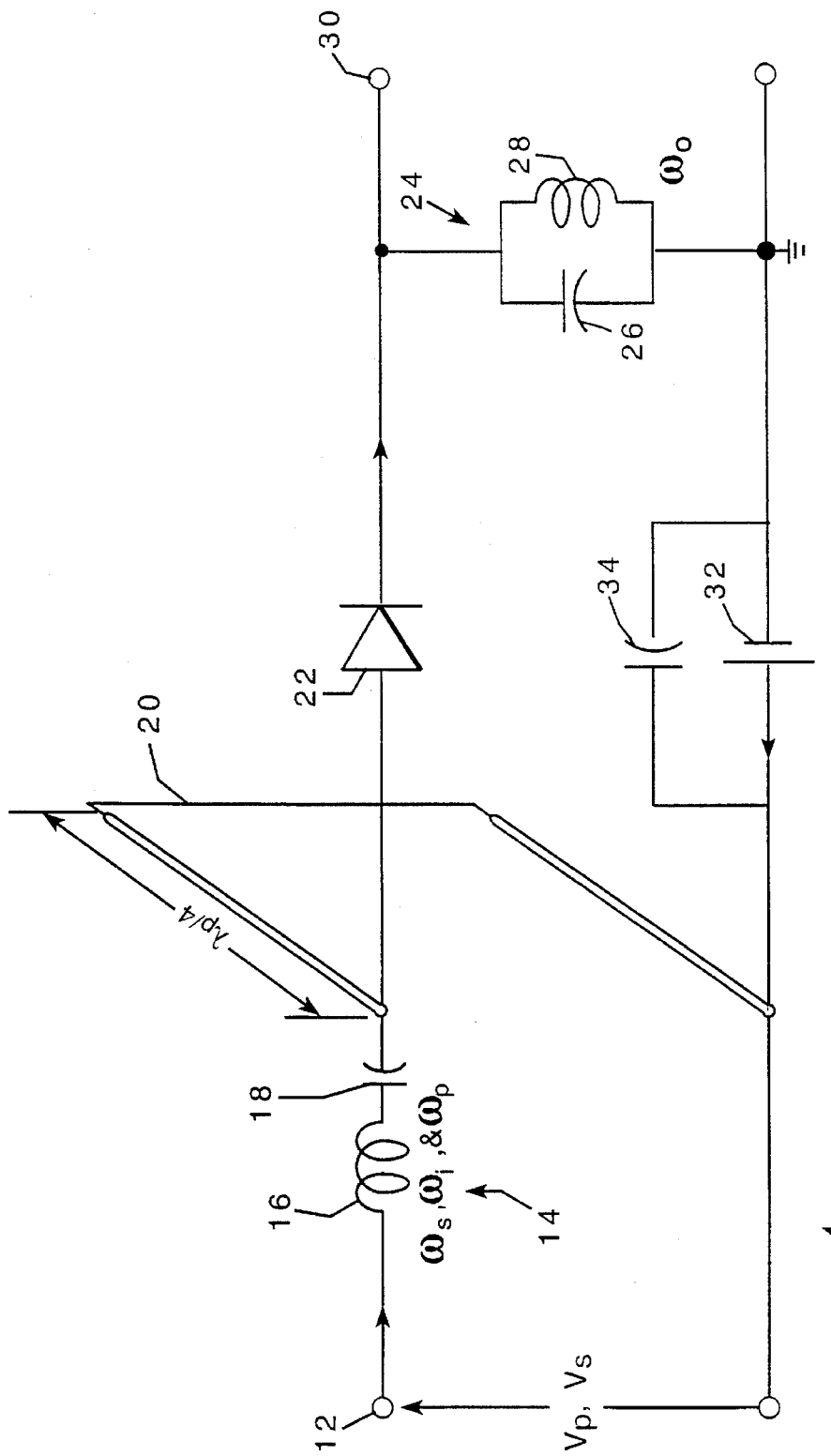
FIG. 1 is a circuit diagram of an ideal H-mixer.
Figure 2:
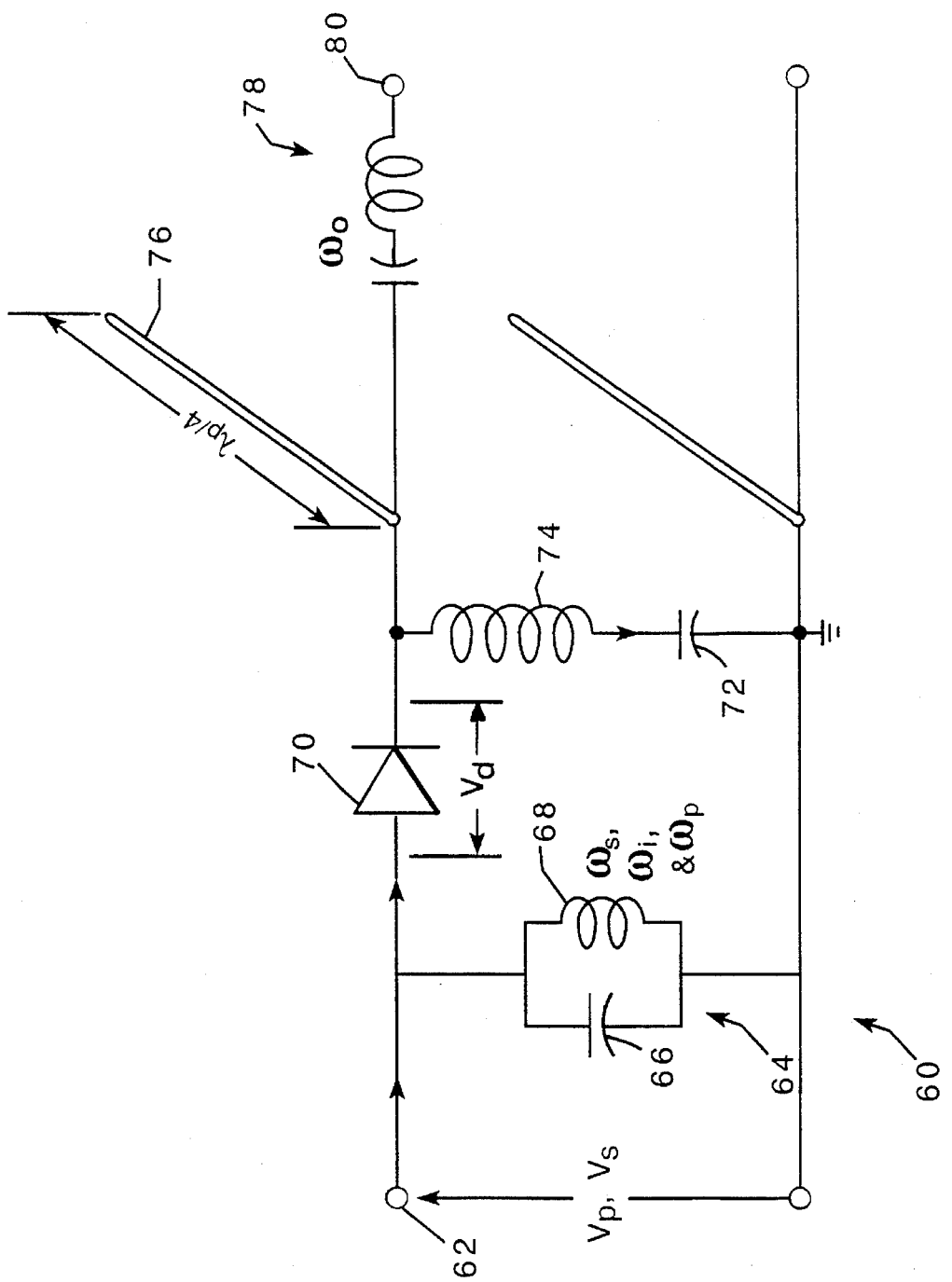
FIG. 2 is a circuit diagram of an ideal G-mixer.
Figure 3:
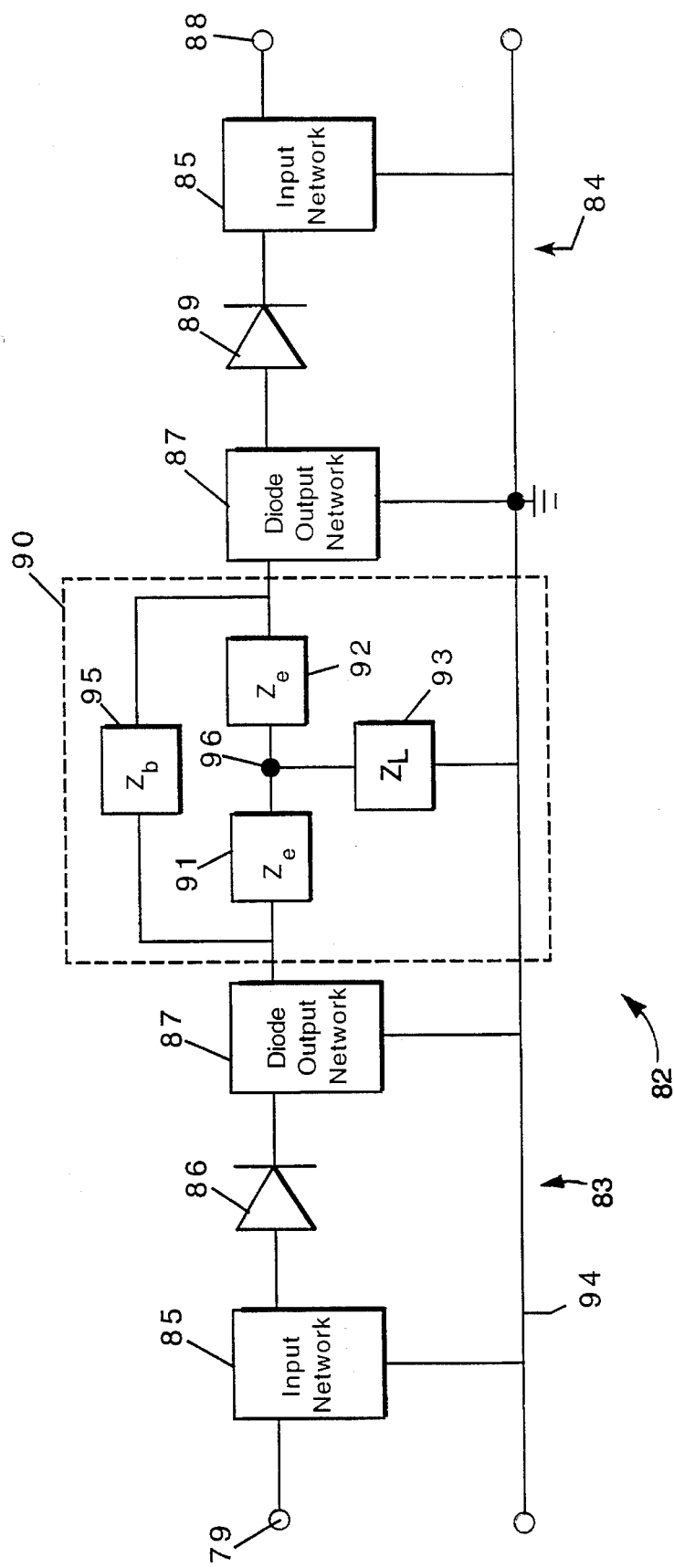
FIG. 3 is a circuit diagram of a general form of a balanced mixer according to the invention.
Figure 4:
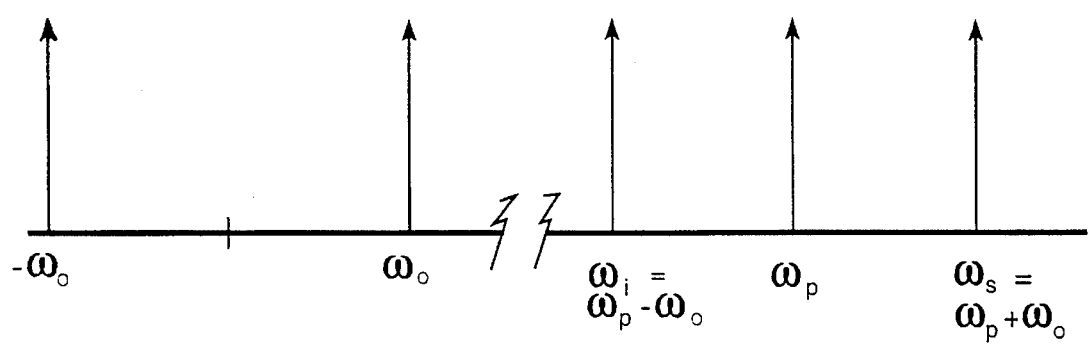
FIG. 4 is a graph of frequencies existing in the circuits of FIGS. 1 through 3 and FIGS. 5 through 8.

Referring to FIG. 3, a balanced mixer 82 approximating the performance of a square-wave reversing switch mixer has two half-circuits 83, 84. A first half-circuit 83 receives a pump wave at a pump frequency ($\omega_p$) and a signal wave at a signal frequency ($\omega_s$) at an input port 79. The frequencies in the mixer (FIG. 4) are restricted such that the intermediate frequency ($\omega_0=\omega_s-\omega_p$) is much lower than the pump frequency. For example, in cellular communications, the pump frequency is typically 815 MHz, while the intermediate frequency is typically 20 MHz.

The first half-circuit receives a combination of the signal wave and the pump wave from the input port in an input network 85, before passing both waves into the cathode of an exponential diode 86. An output of the diode then passes into a diode output network 87.

The second-half circuit 84 receives a different combination of the signal wave and the pump wave at an input port 88. For example, the signal wave and the pump wave may arrive from different ports of a 180 degree hybrid (not shown), a 90 degree hybrid, or any other means which produces the required phasing constraints for the signal waves and the pump waves at the two ports.

Both signals are received in an identical input network 85 before passing into a diode 89. The polarity of the diode is reversed from that of diode 86 in the first half-circuit. An output of the diode then passes into an identical diode output network 87. The two half-circuits 83, 84 are thus symmetrical except for the reversed polarity of the diodes 87, 89.

The two half-circuits are combined in an output combining network 90. In the output combining network, two identical impedances ($Z_e$) 91, 92 in series connect the diode output networks 87 in each half-circuit. A load impedance ($Z_L$) is connected between impedances 91, 92 and ground 94 at an output port 96. A bias impedance ($Z_B$) 95 in the combining network is connected in parallel to both impedances 91, 92.

Each identical diode input network controls a harmonic content of the pump voltages and currents in the mixer and provides impedance matching for the signal wave arriving at the mixer. Each input network also allows a return path for DC bias currents generated from rectification of the pump wave in the diodes. Each input network also modifies the currents and voltages in the circuit in a frequency dependent manner, to supply a set of boundary conditions controlling the operation of the diode associated with the input network, as described in detail below.

Each identical diode output network controls the harmonic content of the pump voltages and currents in the mixer circuit and may provide a path for DC bias current through the diode associated with the output network.

The output combining network allows the intermediate frequency signals arising from the mixing action within each diode to properly sum at the output port of the mixer, provides IF impedance matching to optimize conversion loss in the balanced mixer, and allows a DC path between the diodes to be used for establishing diode bias. The combining network provides isolation between the DC path and the output port of the mixer.

When driven with a pump frequency at an appropriate drive level, the balanced mixer 82 satisfies all the boundary conditions required to closely approximate the performance of an ideal square-wave reversing switch mixer, i.e. the diodes 86, 89 each act as a switch driven by a square wave. As a result, the balanced mixer has a high dynamic range with a low conversion loss.

Specific implementations of the output combining network, the input network and the diode output network are discussed in detail below. All the implementations of the balanced mixer 82 described below provide a separation between the signal wave and the pump wave at the input of the mixer, and provide a DC bias path separated from the output port of the mixer.

Figure 5:
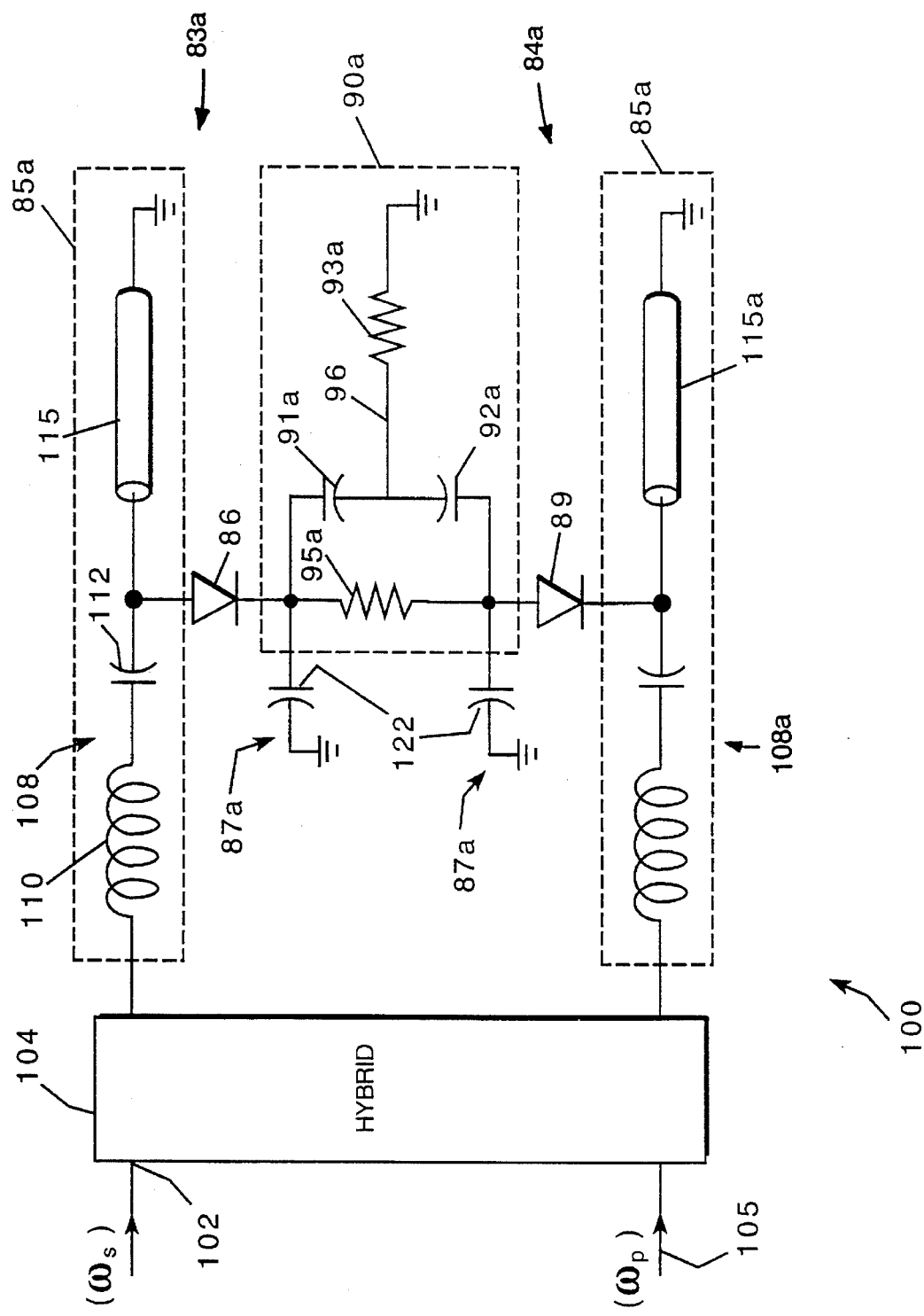
FIG. 5 is a circuit diagram of a balanced H-mixer implementation of the general circuit of FIG. 3, according to the invention.

Referring to FIG. 5, a first implementation of balanced mixer 82 is provided by a balanced H-mixer 100. The mixer 100 receives a signal voltage at a signal frequency ($\omega_s$) in a sum port 102 of a 180 degree hybrid 104 and a pump wave at a pump frequency ($\omega_p$) in a difference port 105 of the hybrid. The hybrid thus provides separation between the signal wave and the pump wave arriving at the mixer.

The hybrid supplies the sum of the pump wave and the signal to a first half circuit 83a and the difference of the signal and the pump wave to a second half circuit 84a. The first half circuit receives the sum of the pump wave and the signal in an input network 85a composed of a filter 108 and a grounded quarter-pump-wavelength transmission line stub 115. The filter 108 has an inductor 110 connected in series with a capacitor 112 that supports currents oscillating only at frequencies $n\omega_p + m\omega_0$, where $n = \pm 1$, $m = \pm 1$ or 0. The filter 108 thus open circuits all frequencies other than the signal frequency the image frequency ($\omega_i = \omega_p - \omega_0$) and the pump frequency. The inductor and capacitor in the input filter are both low loss components over all frequencies present in the mixer 100, and thus act ideally.

Exponential diode 86 is biased from pump-wave rectification to receive currents from the input filter 108 and from the grounded quarter pump wavelength transmission line stub 115. The transmission line stub closely follows ideal circuit constraints to present an open circuit to odd harmonics of the pump frequency and a short circuit to even harmonics of the pump frequency. As a result, the voltage across the diode contains only odd harmonics of the pump frequency, while the current through the diode contains only even harmonics of the pump frequency, in addition to a fundamental-frequency pump current. An anode of diode 86 is connected to a diode output network 87a composed of a grounded capacitor 122.

The second half circuit 84b receives the difference between the signal and the pump wave from the hybrid in an identical input network 85a composed of an LC filter 108a and a grounded quarter wavelength transmission line stub 115a. A cathode of the second diode 89 is connected to a second diode output network 87a consisting of an identical grounded capacitor 122.

The half-circuits 83a, 84a are connected through the output combining network 90a. The anode of diode 86 is connected to the cathode of diode 89 by two capacitors 91a, 92a connected in series. A bias impedance provided by a bias resistor 95a is connected in parallel to capacitors 91a, 92a. A grounded load resistor 93a is connected between impedances 91a, 92a at the output port of the mixer.

The impedance of the grounded capacitors 122 in the diode output networks 87a is chosen to effectively short-circuit all frequencies higher than the intermediate frequency. This ensures that a current at the load resistor oscillates at only the intermediate frequency, as required. For example, when used over the cellular band, the impedance of the grounded capacitor 122 at the pump frequency (approximately 800 MHz) is about 5 Ohms, while at the intermediate frequency (approximately 20 MHz), the impedance of the capacitor is 200 Ohms.

A path for DC currents in the mixer 100 is thus provided between transmission line stub 115, through diode 86, bias resistor 95a, diode 89, and transmission line stub 115a. Since both half-circuits 83a, 84a are identical, the same DC current runs through each diode 86, 89. The resulting DC voltage across the bias resistor thus controls the DC voltage supported by each diode. Capacitors 91a, 92a block the DC current from flowing out to the load resistor, while providing a low impedance path for the intermediate-frequency currents to the load resistor.

The DC bias current path of the mixer is thus separate and isolated from the output of the mixer, allowing the load resistor 93a and the bias resistor 95a to be independently specified to control a current at the output port 96 and the bias voltage of the diodes, respectively. As a result, no separate bias voltage source is required, and no DC currents flow out from the mixer.

In operation, the diodes 86, 89 are driven in-phase with respect to their polarity by the pump wave from the hybrid 104 since the pump voltages at the output of the hybrid are 180 degrees out-of-phase but the polarity of the diodes is reversed in the symmetrical mixer 100. The pump currents through the two diodes therefore possess odd symmetry in the mixer. Concurrently, the signal voltages are in-phase at the output of the hybrid and out-of-phase with respect to diode polarity since the diodes are reversed in the symmetrical mixer. The signal currents through the two diodes therefore possess even symmetry in the circuit. As a result, the generated IF signals from mixing of the pump and signal waveforms are equal but out-of-phase with respect to diode polarity but are in-phase or even with respect to the circuit symmetry. The IF signals thus sum in the load resistor 93a and cancel in the bias resistor 95a.

When driven with a pump frequency at an appropriate drive level, the H-mixer 100 closely approximates the performance of an ideal square-wave reversing switch mixer, as described above in connection with FIG. 3.

In a specific embodiment of the mixer 100 suited for use with cellular signals with a frequency ($\omega_s$) between 869 and 894 MHz, capacitor 112 in filters 108, 108a has a capacitance of 1 pF while inductor 110 has an inductance of 33 nH. Transmission line stubs 115, 115a are 1.42 inches long with a dielectric constant of approximately 9.6. Capacitors 122 in the diode output networks are 25 pF each, while the bias resistor is 240 Ohms. Each capacitor 91, 92a is 20,000 pF, and the load resistor is 50 Ohms.

Figure 6:
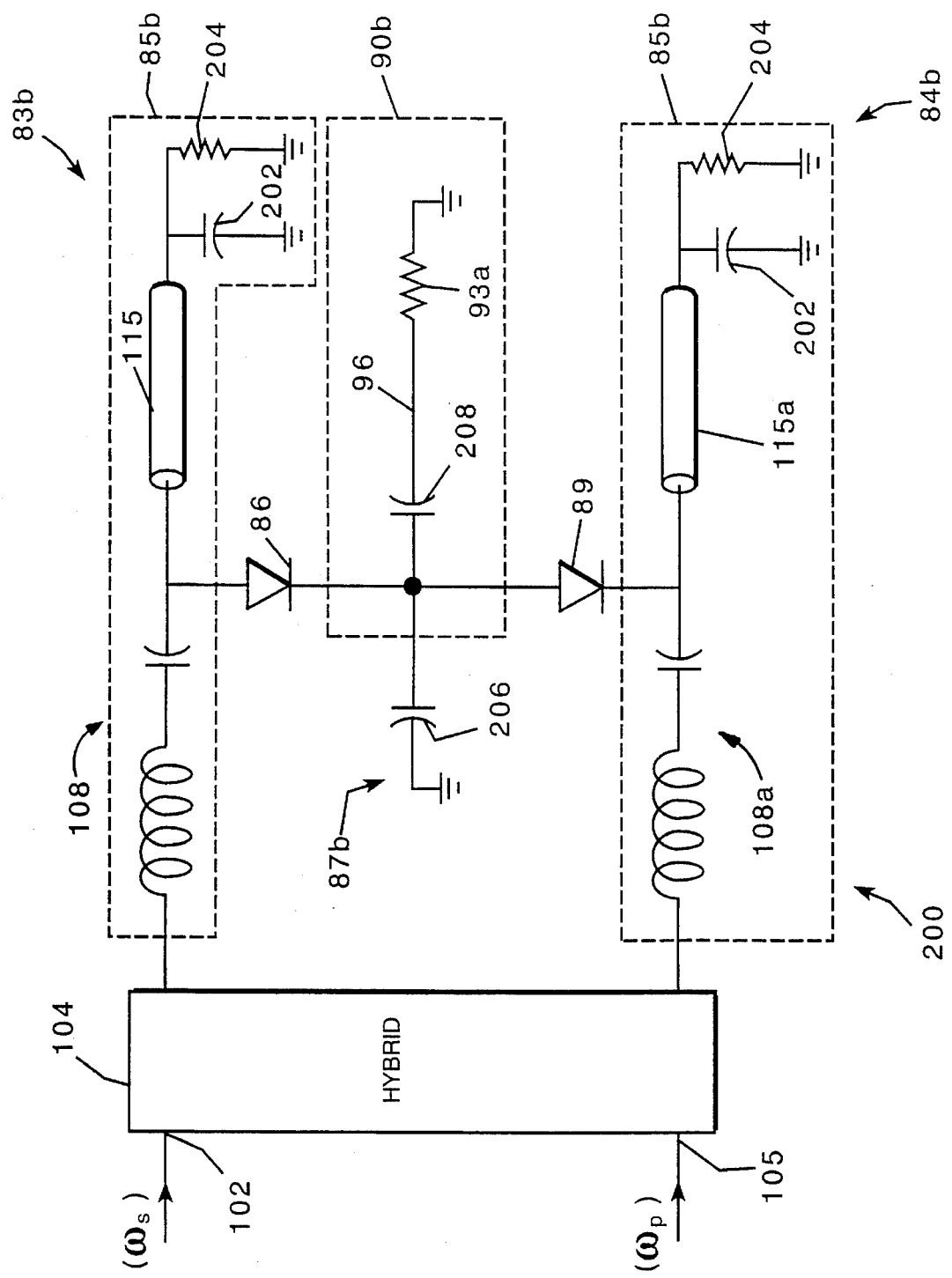
FIG. 6 is a circuit diagram of another balanced H-mixer implementation of the general circuit of FIG. 3.

Another implementation of a balanced H-mixer 200, shown in FIG. 6, is obtained by making the following modifications to H-mixer 100 (FIG. 5). Each input network 85b in half-circuits 83b, 84b is identical input networks 85a of mixer 100, except that each transmission line stub 115, 115a in the networks 85b is terminated with a grounded capacitor 202 placed in parallel with a grounded bias resistor 204.

Bias resistor 204 allows the bias resistor 95 (FIG. 5) to be removed from the output combining network 90b of the mixer 200. This allows the mixer to be further simplified by collapsing capacitors 91a, 92a into a single capacitor 208 connected between diodes 86, 89 and the load resistor 93a. In addition, the diode output networks 87a (FIG. 5) are combined into a single grounded capacitor 206 connected between the diodes to form the new diode output network 87b.

A path for DC currents in H-mixer 200 is thus provided from bias resistor 204 in the half-circuit 83b, through the quarter wavelength transmission line 115, diode 86, diode 89 and back through transmission line stub 115a to bias resistor 204 in half-circuit 84b. Each capacitor 202 on the transmission line stubs is large enough to effectively short AC currents in the mixer to cause the AC currents to bypass the bias resistors 204.

In one specific implementation, H-mixer 200 has an input filter 108 consisting of a 33 nH inductor and a 1 pF capacitor. The 1.42 inch transmission line stubs have a dielectric constant of approximately 9.6. The bias resistors are each 120 Ohms, while capacitors 202 are 10,000 pF. Capacitor 206 is 47 pF, capacitor 208 is 10,000 pF, and the load resistor is 50 Ohms.

Figure 7:
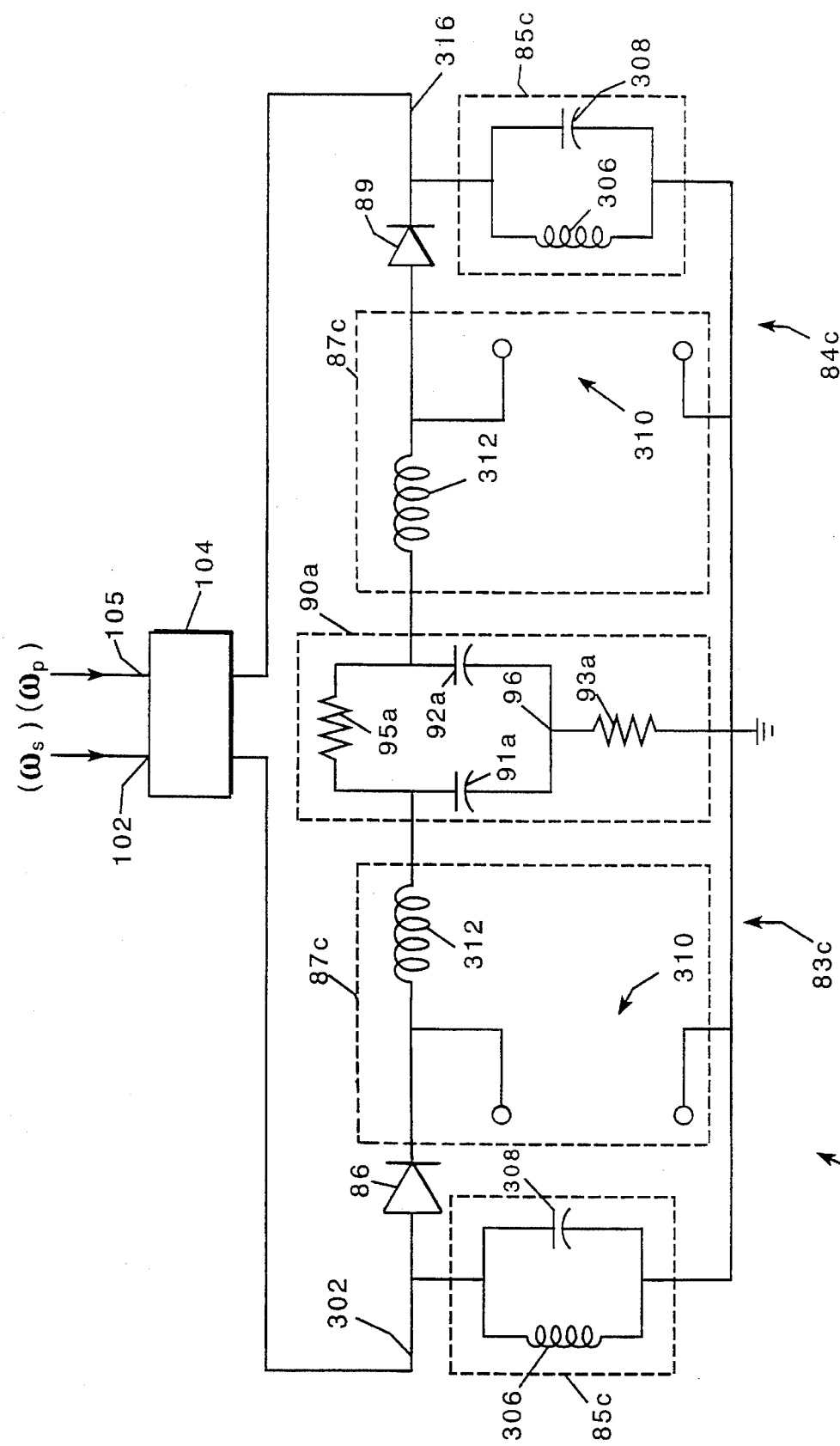
FIG. 7 is a circuit diagram of a balanced G-mixer implementation of the general circuit of FIG. 3.

Referring to FIG. 7, G-mixer 300 is the dual of H-mixer 100 shown in FIG. 5. The first half-circuit 83c receives the sum of the signal voltage and the pump voltage from a 180 degree hybrid 104 at an input port 302. Both the signal and the pump wave pass into an input network formed of an LC tank 85c connected between the input port and ground. The LC tank contains a low-loss inductor 306 and a capacitor 308 connected in parallel that support voltages at only the pump frequency, the signal frequency and the image frequency.

Currents from the input port and the LC tank pass through an exponential diode 86 before being filtered in a diode output network 87c. The diode output network includes a parallel open-circuited quarter-pump-wavelength transmission line stub 310 and a series low-loss inductor 312. The transmission line stub presents an open-circuit to even harmonics of the pump wave frequency and a short-circuit to odd harmonics of the pump wave frequency. Inductor 312 provides a suitably low impedance to currents at the intermediate frequency and a high impedance to currents at all higher frequencies in the mixer.

The second half-circuit 84c balances the mixer by receiving a difference between the signal and the pump wave in a second input port 316. Signals from the input port 316 pass through an identical input network 85c before passing through a reversed-polarity second diode 89. An output of the diode is received in an identical diode output network 87c.

The half-circuits 83c, 84c are connected by an output combining network 90a that has the same structure as the combining network 90a in the H-mixer 100 (FIG. 5). The inductors 312 are connected by series capacitors 91a, 92a in the combining network. Bias resistor 95a is connected in parallel to capacitors 91a, 92a, while grounded load resistor 93a is connected between capacitors 91a, 92a at output port 96.

A DC bias current path in the mixer thus exists through the low-loss inductor 308 in the first half-circuit 83c, the first diode 86, through low-loss inductor 306, the bias resistor 89, low-loss output inductor 312 in the second half-circuit 84c, the second diode 89, and back through the low-loss inductor 306 in the second input network. Capacitors 91a, 92a effectively prevent DC currents from flowing into the load resistor 93a, in the manner described above in connection with FIG. 5. The DC current through the bias resistor thus provides the bias voltage for each diode.

AC currents at the intermediate frequency are diverted from the bias resistor by symmetry since they are of even mode in the circuit and may only flow into the load resistor 93a where they sum. Because the ground path is separate from the output of the mixer at the load resistor, the load resistor and the bias resistor can be independently specified to control the bias voltage for the diodes and the output current of the mixer.

Other embodiments are within the following claims. For example, a 90 degree hybrid can replace the 180 degree hybrid, e.g. a JH-140 90 degree hybrid available from ANZAC in Waltham, Mass. The signal and pump ports may be interchanged for either hybrid with no change in performance. In addition, each diode 86, 89 in the H and G mixers described above can be replaced by two diodes connected in series to sustain a larger breakdown voltage for higher dynamic range.

Figure 8:
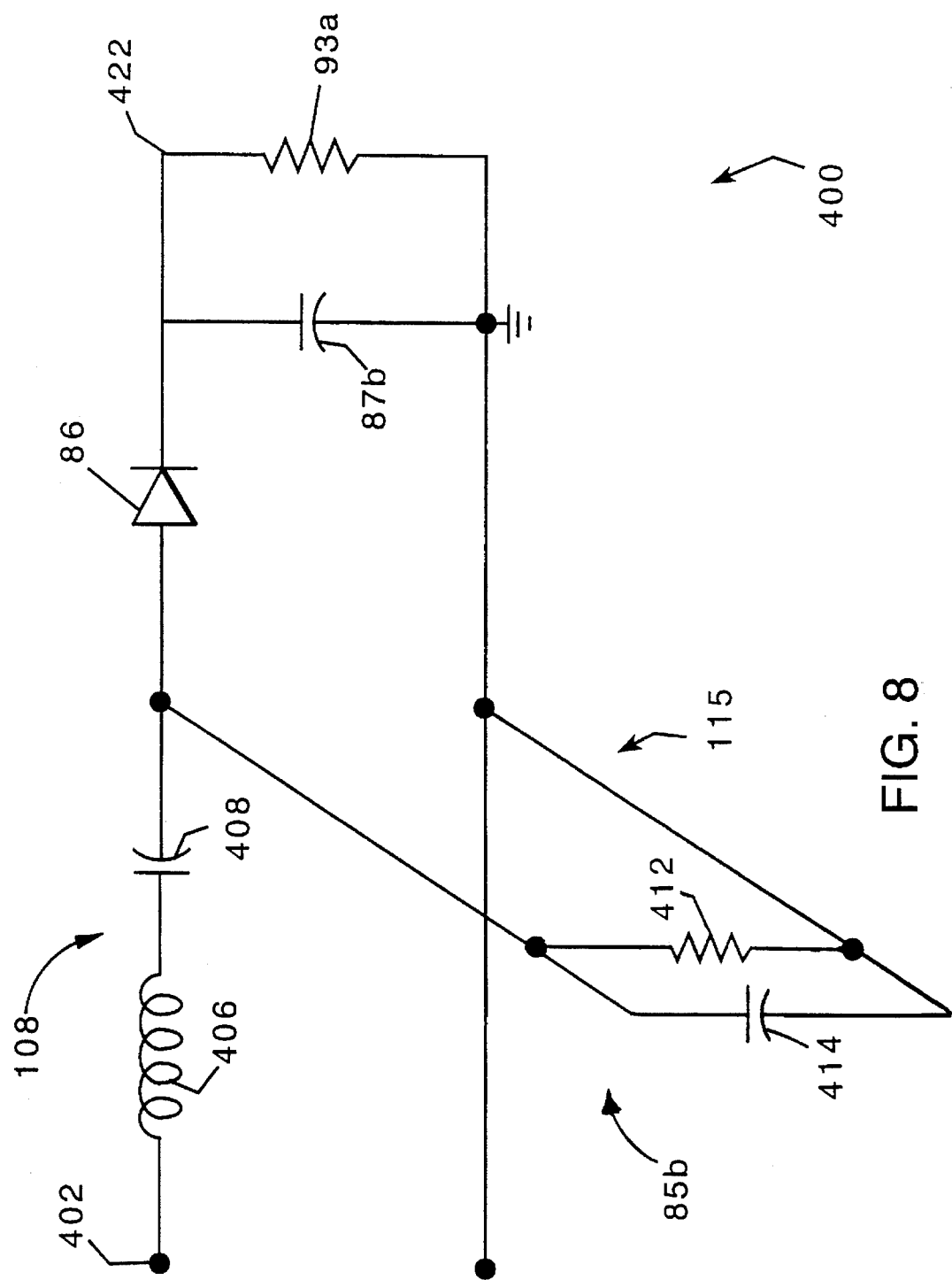
FIG. 8 is a circuit diagram of a single port H-mixer.

In another implementation, a single port H-mixer 400, shown in FIG. 8, has the features of half the balanced H-mixer 200 shown in FIG. 6. The signal and the pump waves are received over an input port 402 before passing through an input network 85b. The input network has a series LC filter 108 and a parallel quarter-pump-wavelength transmission line stub 115. The LC filter has an inductor 406 and capacitor 408 in series that support currents at only the pump frequency, the signal frequency and the image frequency. The transmission line stub has a bias resistor 412 and a capacitor 414 connected in parallel at the output of the stub.

Diode 86 carries currents from the transmission line stub and the LC filter to a diode output filter including a parallel capacitor 87b. The capacitor 87b is a short-circuit to all frequencies above the intermediate frequency. A load resistor 93a is connected in parallel to the capacitor 87b at the output 422 of the mixer.

The transmission line stub 115 allows the voltage across the diode 86 to contain only odd harmonics of the pump frequency while the current through the diode contains only even harmonics of the pump frequency in addition to the fundamental frequency.

DC currents in the mixer pass through the bias resistor 412, to the diode 86, and back through the load resistance 93a. The DC current through the bias resistor and the load resistor thus controls the DC voltage across the diode.

What is claimed is:

1. A mixer for converting a frequency of an input signal to an intermediate frequency, comprising a first input port receiving an input signal oscillating at a signal frequency and a sinusoidal pump wave oscillating at a pump frequency, a first input network connected to the input port, a first diode connected to an output of the input network at a first end, a first diode output network connected to a second end of the diode, the diode output network and the input network together causing the diode to switch rapidly between ON and OFF states, an output port connected to the diode output network, the output port supporting frequencies at the intermediate frequency, and bias circuitry connected to the diode, the circuitry comprising a resistor connected to receive a DC component of current from the diode, the current through the resistor solely biasing the diode.

2. The mixer of claim 1 wherein the input network comprises circuitry selectively allowing voltages and currents oscillating at a given set of frequencies to exist at the output of the input network.

3. The mixer of claim 2 wherein the circuitry allows currents oscillating at frequencies of $m\omega_p + n\omega_0$ to exist at the output of the input network, (m) and (n) being integers, $\omega_0$ being the intermediate frequency, $\omega_p$ being the pump frequency.

4. The mixer of claim 3 wherein the input network comprises an inductor connected in series with a capacitor.

5. The mixer of claim 2 wherein the input network further comprises a harmonic filter connected to receive an output of the circuitry in the input network, a second port of the harmonic filter being connected to ground, the harmonic filter short-circuiting even harmonics of the pump wave and open circuiting odd harmonics of the pump wave.

6. The mixer of claim 5 wherein the harmonic filter comprises a transmission line stub with a length equal to one quarter a wavelength of oscillation of the pump wave.

7. The mixer of claim 1 wherein the diode output network comprises circuitry supporting a voltage oscillating at the intermediate frequency.

8. The mixer of claim 7 wherein the diode output network comprises a capacitor, the capacitor being of low impedance at all frequencies larger than the intermediate frequency.

9. The mixer of claim 1 wherein the resistor in the bias circuitry comprises a load resistor connected to the diode at the output port of the mixer.

10. The mixer of claim 5 wherein the resistor in the bias circuitry is connected to the diode through the input network, the resistor being connected between the second port of the harmonic filter in the input network and ground.

11. The mixer of claim 10 further comprising a capacitor connected in parallel to the resistor between the second port of the harmonic filter and ground.

12. The mixer of claim 2 wherein the circuitry in the input network allows a voltage oscillating at frequencies of $n\omega_p + m\omega_0$ to exist at the output of the input network, (n) and (m) being integers, $\omega_0$ being the intermediate frequency, $\omega p$ being the pump frequency.

13. The mixer of claim 12 wherein the circuitry in the input network comprises an inductor and a capacitor connected in parallel to the input port of the mixer.

14. The mixer of claim 1 wherein the diode output network comprises a harmonic filter open circuiting even harmonics of the pump frequency and short circuiting odd harmonics of the pump frequency, the harmonic filter being connected between the second end of the diode and ground.

15. The mixer of claim 14 wherein the diode output network additionally comprises circuitry supporting a current at the intermediate frequency.

16. The mixer of claim 15 wherein the circuitry in the output network comprises an inductor connected in series to the harmonic filter.

17. The mixer of claim 1 further comprising circuitry balancing the mixer, the circuitry comprising a second input port receiving a combination of the signal wave and the pump wave, a second input network connected to receive the combination of the signal wave and the pump wave from the input port, a second diode of reversed polarity to the first diode connected to an output of the second input network at a first end, and a second diode output network connected to a second end of the second diode, the second diode output network and the second input network together causing a voltage across the second diode and a current across the second diode to switch rapidly between ON and OFF states, and an output combining network connecting the second diode output network to the first diode output network, the combining network connecting each diode to the output port of the mixer to allow intermediate frequency signals from each diode to add at the output port, the combining network including a path for DC current between the two diodes that is isolated from the output port of the mixer, the bias circuitry being connected to the second diode to bias the second diode in the same direction as the first diode.

18. The mixer of claim 17 further comprising a hybrid connected to receive the input signal in a first input port and the pump wave voltage in a second input port, a first output port of the hybrid being connected to the first input port of the mixer, a second output port of the hybrid being connected to the second input port of the mixer.

19. The mixer of claim 18 wherein the hybrid comprises a 180 degree hybrid.

20. The mixer of claim 18 wherein the hybrid is a 90 degree hybrid.

21. The mixer of claim 18 wherein the hybrid is connected to receive the input signal in a sum port and the pump wave in a difference port, the first output port of the hybrid supplying the sum of the pump wave and the input signal to the first input port of the mixer, the second output port of the hybrid supplying the difference of the pump wave and the input signal to the second input port of the mixer.

22. The mixer of claim 17 wherein the first input network comprises a harmonic filter connected to the input port, a second port of the harmonic filter being connected to ground, the harmonic filter short-circuiting even harmonics of the pump wave and open circuiting odd harmonics of the pump wave, and wherein the second input network comprises a second harmonic filter connected to the second input port, a second port of the second harmonic filter being connected to ground.

23. The mixer of claim 17 wherein the first input network and the second input network each comprise circuitry allowing currents oscillating at frequencies of $m\omega_p + n\omega_0$ to exist at the output of each input network, (m) and (n) being integers, $\omega_0$ being the intermediate frequency, $\omega_p$ being the pump frequency.

24. The mixer of claim 22 wherein the resistor in the bias circuitry is connected to the first diode through the first input network, the resistor being connected between the second port of the first harmonic filter in the first input network and ground.

25. The mixer of claim 24 wherein the bias circuitry further comprises a second resistor connected to the second diode through the second harmonic filter, the resistor being connected between the second port of the second harmonic filter and ground.

26. The mixer of claim 25 further comprising a first capacitor connected in parallel to the resistor between the second port of the first harmonic filter and ground, and a second capacitor connected in parallel to the second resistor between the second port of the second harmonic filter and ground.

27. The mixer of claim 17 wherein the second diode output network comprises a capacitor connected between the second end of the second diode and ground.

28. The mixer of claim 17 wherein the combining network comprises a capacitor connecting each diode to the output port of the mixer.

29. The mixer of claim 17 wherein the resistor in the bias circuitry is connected within the combining network between the second end of the first diode and second end of the second diode.

30. The mixer of claim 29 wherein the output combining network comprises a capacitor connected between the second end of the first diode and the output port, and a second capacitor connected between the second end of the second diode and the output port.

31. The mixer of claim 17 wherein the first diode output network comprises a first harmonic filter connected between the second end of the first diode and ground, the harmonic filter short-circuiting odd harmonics of the pump wave and open circuiting even harmonics of the pump wave, and wherein the second diode output network comprises a second harmonic filter connected between the second end of the second diode and ground.

32. The mixer of claim 31 wherein the diode output network further comprises a first inductor connected between the second end of the first diode and the output combining network, and a second inductor connected between the second end of the second diode and the output combining network.

33. A mixer for converting a frequency of an input signal to an intermediate frequency, comprising a hybrid receiving an input signal oscillating at a signal frequency at a first port and a pump wave oscillating at a pump frequency at a second port, a first circuit receiving a first output of the hybrid, comprising an input network connected to receive the first output of the hybrid, a first diode connected to an output of the input network at a first end, a second circuit receiving a second output of the hybrid, comprising a second input network connected to receive the second output of the hybrid, a second diode of reversed polarity to the first diode, the second diode being connected to an output of the second input network at a first end, a bias resistor connecting the first circuit to the second circuit, the resistor establishing a path between a second end of the first diode to a second end of the second diode, the resistor diverting a DC current from an output port of the mixer, and a diode output network connected to both the second diode and to the first diode, the diode output network and the second input network together causing the second diode to switch rapidly between ON and OFF states, the diode output network and the first input network together causing the first diode to switch rapidly between ON and OFF states.

\* \* \* \* \*